United States Patent [19]

Vig

[11] 4,416,726
[45] Nov. 22, 1983

[54] METHOD AND APPARATUS FOR CORRECTING THE ANGLES OF CUT OF QUARTZ PLATES

[75] Inventor: John R. Vig, Colts Neck, N.J.

[73] Assignee: The United States of America as represented by the Secretary of the Army, Washington, D.C.

[21] Appl. No.: 359,534

[22] Filed: Mar. 18, 1982

[51] Int. Cl.³ .................. B44C 1/22; C03C 15/00; C03C 25/06
[52] U.S. Cl. .................. 156/643; 156/345; 156/645; 156/654; 156/663
[58] Field of Search ............ 156/643, 645, 651, 654, 156/659.1, 345, 661.1, 663; 51/283 R, 283 E, 310; 250/492 R, 492 B

[56] References Cited

U.S. PATENT DOCUMENTS

| | | | |
|---|---|---|---|
| 3,489,564 | 1/1972 | Schaefer | 96/36 |
| 3,694,677 | 9/1972 | Guttwein et al. | 310/9.6 |
| 3,803,774 | 4/1974 | Miller | 57/283 |
| 3,951,728 | 4/1976 | Egashira et al. | 156/654 X |

OTHER PUBLICATIONS

Proceedings of the 30th Annual Symposium on Frequency Control, (1976), pp. 259–263, "A Method of Angle Correction", D. Husgen, et al.
Proceedings of 1980 IEEE Ultrasonics Symposium, "What Saw Can Learn From Baw . . . ", T. Lukaszek, et al.

Primary Examiner—William A. Powell
Attorney, Agent, or Firm—Robert P. Gibson; Jeremiah G. Murray; Edward Goldberg

[57] ABSTRACT

An improvement in the technique of correcting the angles of cut of quartz resonator plates is disclosed. Photolytic etching the crystal blanks comprises the preferred method. Flat-pack or pill-box type holders include masking members which mask the appropriate portion of the blank. Teflon and Kalrez comprise preferred materials for fabricating the masking elements since such materials are resistant to the etching material utilized. Mesas are formed during etching and the blanks are thereafter lapped to provide the desired angle of cut. When desirable, the masking element is withdrawn at a uniform rate during etching so that the angle is corrected without the need for lapping.

19 Claims, 6 Drawing Figures

METHOD AND APPARATUS FOR CORRECTING THE ANGLES OF CUT OF QUARTZ PLATES

The invention described herein may be manufactured, used and licensed by or for the Government for governmental purposes without the payment to me of any royalties thereon.

CROSS REFERENCE TO RELATED APPLICATIONS

This application is related to the following applications which are assigned to the assignee of the present invention: U.S. Ser. No. 361,657, entitled, "Quartz Resonator Angle Correction" filed on Mar. 25, 1982, in the name of Arther Ballato; and of the invention, U.S. Ser. No. 361,655, entitled, "Analog Correction of Quartz Resonator Angle of Cut", filed on Mar. 25, 1982, in the name of Arthur Ballato.

BACKGROUND OF THE INVENTION

This invention relates generally to quartz crystal resonators for frequency control apparatus and the like and more particularly to a technique for accurately correcting the angles of cut of quartz crystal blanks or plates.

It is well known that quartz crystal plates utilized for frequency control apparatus cannot be cut with sufficient accuracy where high precision applications are intended. Thus following the initial cutting operation, the crystal blanks usually must have their orientation angles corrected prior to their installation in the respective equipment with which they are to be utilized.

In U.S. Pat. No. 3,803,774 entitled, "Technique For Correcting The Crystallo-Graphic Orientation Angle of Crystals by the Formation of Mesas and Double Face Lapping", issued to A. J. Miller on Apr. 16, 1974, several possible techniques are disclosed for correcting the angles of cut of quartz plates and involves first the formation of mesas by various techniques such as etching, machining, or mounting a chip on the surface of the plate, followed by a double face lapping operation until the mesas are removed, at which point the orientation angle has been changed the desired amount and the lapped surfaces of the plate are substantially parallel. An inherent problem, however, arises in the masking of the quartz plates during the etching process because the masking material itself is also subject to etching. Also the complexity of the method of applying and removing the masking materials themselves provides a limitation. Various tapes, photo-resists and solder resists have been evaluated by several investigators, but to date none has proved to be satisfactory. Chemical and ion etching has been suggested in U.S. Pat. No. 3,694,677, entitled, "VHF-UHF Piezoelectric Resonators", issued to G. K. Guttwein, et al. on Sept. 26, 1972. In U.S. Pat. No. 3,489,564, entitled, "Photolytic Etching of Silicon Dioxide" issued to D. L. Schaefer on Jan. 13, 1970, there is generally disclosed a photolytic process whereby etching of a predetermined pattern for decorative or optical purposes is achieved by exposing the surface of the body to be etched with radiation and which has been previously treated by a photolytically decomposable liquid; however, such a process has not heretofore been suggested for correcting the angles of cut of quartz resonators.

It is an object of the present invention, therefore, to provide an improvement in the method and apparatus for correcting the angles of cut of quartz resonator plates.

It is a further object of the present invention to provide an improvement in the formation of mesas on a quartz resonator plate for correcting the oeientation angles.

Still another object of the present invention is to provide an improvement in the method of etching at least one major face of a quartz resonator plate for correcting the angles of cut.

SUMMARY

These and other objects are achieved in accordance with the subject invention by utilizing an etching technique, preferably photolytic etching, along with the use of quartz crystal blank holders and masking elements comprised of tetrafluoroethylene, polytetrafluoroethylene or a perfluoroelastomer for the formation of a mesa on or otherwise altering the surface configuration of at least one but usually both major faces of a resonator blank which is thereafter normally machine lapped to provide the corrected angle of cut. Localized heating of the crystal during photolytic etching is also intended to further vary the contour of etched face. The lapping step can further be eliminated or at least minimized by withdrawing the masking element or elements from the face of the crystal blank or plate in a predetermined direction at a predetermined, normally uniform rate. Where masking elements are withdrawn from opposite faces simultaneously, they are withdrawn in opposite directions.

DESCRIPTION OF THE PREFERRED EMBODIMENTS

Figure 1A:
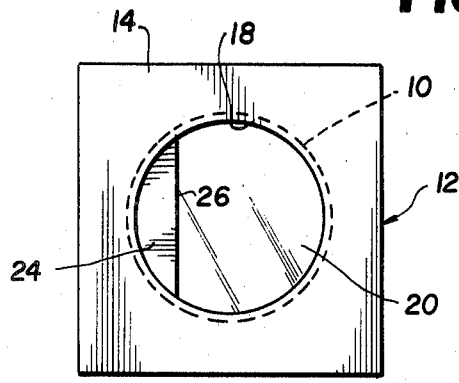
FIGS. 1A and 1B are illustrative of top plan and central cross sectional views of a first embodiment for forming a mesa on one major face of a crystal resonator blank.
Figure 1B:
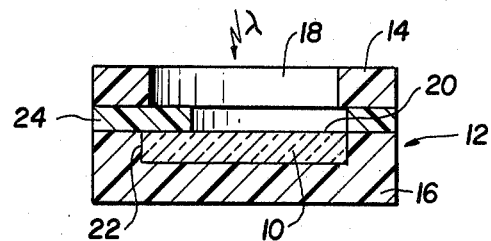
Figure 2:
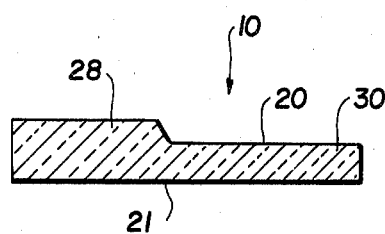
FIG. 2 is a cross sectional view of a circular crystal resonator blank having a mesa formed on one side thereof by the apparatus shown in FIGS. 1A and 1B.

Referring now to the drawings, wherein like reference numerals refer to like parts, and more particularly to FIGS. 1A and 1B, reference numeral 10 designates a circular rimmed quartz crystal resonator blank whose angles of cut require correcting and which is located in a pill-box type of holder 12 consisting of an upper and lower rectangularly square shaped members 14 and 16. The two members 14 and 16 are comprised of plastic material preferably consisting of tetrafluoroethylene/-polytetrafluoroethylene, commonly referred to by its trade name "Teflon". The upper member 14 includes a central circular opening 18 which substantially coincides with the rim of the crystal blank 10 for permitting radiation of a predetermined wavelength λ to be directed to the upper major surface or face 20. The bottom member 16 is also comprised of Teflon and additionally includes a circular recess 22 for accommodating and holding the blank 10 in place. Intermediate the upper and lower holder members 14 and 16 is a "Teflon" masking element 24 which is adapted to have a straight edge 26 which extends across the major face 20 in the region of the opening 18 as shown in FIG. 1A. The major face 20 of the blank is further treated with a photolytic etchant such that when the incident radiation of wavelength λ strikes the unmasked portion of the major face 20 the etchant becomes chemically reactive with the underlying surface of the crystal blank 10 causing that specific region to be etched away while leaving the region underlying the mask 24 uneffected. The resulting configuration of the crystal blank 10 is as shown in FIG. 2 resulting in a mesa 28 being formed while leaving a depressed region 30. The degree or depth of etching is determined by the time of exposure to the incident radiation and accordingly etching can be stopped merely by blocking any further radiation onto the surface 20 of the blank 10.

When desirable, the mask element 24 can be integrated into the upper holder element 14 to form a composite structure; however, the inclusion of the separate masking element 24 permits any desired orientation of the edge 26 relative to the crystal axes simply by rotating the mask 24 to the proper portion of the crystal blank. Since "Teflon" has a relatively high surface tension, a composite blank holder and mask combination can be simply pressed against the upper and lower major surfaces 20 and 21 of the blank 10. Also when desirable, photolytic etching can be effected simultaneously on both major faces 20 and 21. While photolytic etching comprises the preferred method of angle correction, the plastic material from which the holder and masking members 14, 16 and 24 are fabricated makes ion and abrasive etching techniques also feasible with the same elements.

Since the method of photolytic etching depends on the specific wavelengths utilized for radiation of the crystal blank, if the wavelength is in the region where quartz has a high transmission, then a glancing angle of incidence can be used in order to assure that only the desired portion of the blank is etched. If, on the other hand wavelengths are used which are in the region where quartz absorbs, then the angle of incidence would not be of a great significance.

While "Teflon" was noted to comprise the preferred material from which the holder and masking elements are fabricated, the embodiment of FIGS. 1A and 1B can, when desirable, be fabricated from a high temperature perfluoroelastomer type of material marketed by DuPont under the trade name "Kalrez", which material is also impervious to the attack of photolytic etchants.

Since the photolytic etching rate of quartz varies exponentially with temperature, the desired portion of the resonator blank can be etched along with localized heating of either the appropriate portion of the blank or of the etchant solution near that portion. Such localized heating may be achieved by heating with an IR laser or by using small heater elements placed in close proximity to the blank. Such heater elements may be formed by using alloys that are resistant to the etchant such as Monel or Hastalloy X or by using ordinary resistance alloys having a "Teflon" or "Kalrez" insulation covering.

Figure 3A:
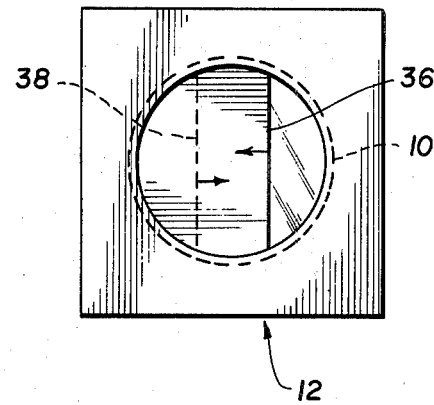
FIGS. 3A and 3B disclose a top plan view and a central cross sectional view of yet another embodiment of the invention for forming inclined surfaces on both major faces of a quartz resonator blank in accordance with the subject invention.
Figure 3B:
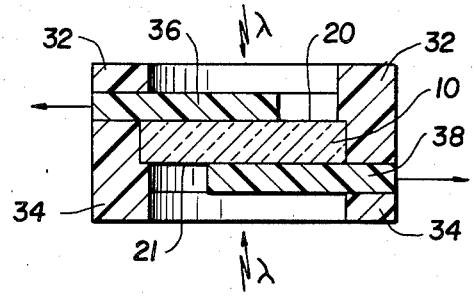
Figure 4:
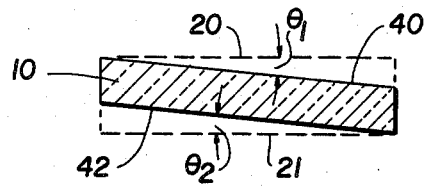
FIG. 4 is a cross sectional view of a quartz resonator plate having the angle of cut modified by the apparatus shown in FIGS. 3A and 3B.

Whereas the photolytically etched crystal resonator blank 10 as shown in FIG. 2 normally requires a subsequent double lapping operation of the mesa 28 and the etched surface 30 in order to provide smooth corrected angles of cut and since the same procedure would also be performed on the lower major surface 21, the present invention also contemplates an embodiment for etching, preferably photolytic etching, wherein the lapping procedure may be substantially eliminated or at least minimized. Such an embodiment is shown in FIGS. 3A and 3B wherein reference numerals 32 and 34 denote upper and lower elements which are additionally adapted to hold or engage the resonator blank 10 at its periphery. The masking structure is configured such that a pair of slidable "Teflon" or "Kalrez" masking elements 36 and 38 are placed adjacent the major faces 20 and 21. With a photolytic etchant material being placed on the major surfaces 20 and 21 of the blank, the subsequent withdrawal of the masking elements 36 and 38 in opposite directions at a uniform rate will result in sloped surfaces 40 and 42 being formed and providing corrected equal angles $\theta_1$ and $\theta_2$ with respect to the original faces 20 and 21 as shown in FIG. 4. The slower the rate of mask withdrawal, the larger will be the shift of the angle $\theta$.

Thus what has been shown and described is an improved technique for correcting the angles of cut of quartz resonator plates providing components which can be used for the improvement of acceleration resistant resonators, bulk and SAW filters, and force, pressure and temperature transducers. The crystal plates need not be circular to start with but by proper masking, portions of the plates of any shape can be etched by this technique.

While the foregoing detailed description has been made with a certain degree of particularity, it should be noted that the same has been provided by way of illustration and not of limitation. Accordingly, all modifications, alterations and changes coming within the spirit and scope of the invention as defined in the appended claims are herein meant to be included.

What is claimed is:

1. The improved method of correcting the angles of cut of a crystal resonator blank having a pair of opposing major faces comprising the steps of:
  (a) mounting said crystal blank in a holder of etch resistant material;
  (b) positioning said blank and holder in the path of a source capable of effectuating etching of an exposed face of said blank;
  (c) masking a selected portion of at least one of said major faces with said etch resistant material to provide an exposed face portion; and
  (d) subjecting the exposed face portion to said source to cause said exposed face portion to be etched away to a predetermined depth.

2. The method as defined by claim 1 including the step of:
  (e) applying a photolytic etchant to the exposed face portion after step (c) and wherein said source is a source of radiation of a predetermined wavelength, and thereafter directing said source at said exposed face for a predetermined time.

3. The method as defined by claim 2 wherein said crystal resonator blank is quartz and said material is selected from the group consisting of tetrafluoroethylene, polytetrafluoroethylene and a perfluoroelastomer.

4. The method as defined by claim 2 including the further step of heating a selected portion of said blank for varying the etching rate in the localized region of heating.

5. The method as defined in claim 2 wherein said masking step (b) comprises the step of pressing a masking element directly against said one major face and wherein the masking material has a relatively high surface tension whereby self adherence thereto is provided.

6. The method as defined by claim 2 including the steps (b) (c) (e) and (d) for the opposite major face of said pair of opposing major faces.

7. The method as defined by claim 6 including the further step (f) of lapping the etched and unetched portions of both said major faces to form respective generally uniform flat corrected major faces.

8. The method as defined by claim 2 wherein said masking step (c) comprises applying a first mask of solid material against said at least one major face and additionally including the step of withdrawing said mask gradually in a first predetermined direction from said major face during step (d) to vary the depth of etching across said major face as a function of the rate of withdrawal.

9. The method as defined by claim 8 wherein said masking step (c) additionally comprises applying a second mask of solid material against the other of said major faces and said step of withdrawing said mask additionally includes withdrawing the second mask applied to said other major face gradually in an opposite direction from said first mask whereby the depth of etching varies across the respective faces in opposite directions.

10. The method as defined by claim 9 wherein both said masks are withdrawn at a uniform rate to provide relatively parallel major faces having respective facial angles shifted by an amount determined by the rate of withdrawal.

11. Apparatus for correcting the angle of cut of a crystal resonator blank comprising:
a source capable of effectuating etching of an exposed face of a crystal resonator blank; and
a holder for said crystal resonator blank positioned in the path of said source and including masking means adapted to cover a selected face portion of said blank and expose a face portion to said source;
said holder and masking means being of an etch resistant material;
said source being directed at said exposed face portion for a predetermined period of time to cause a selected portion of said blank to be etched away.

12. The apparatus as defined by claim 11 wherein said masking means is movable relative to said holder to permit selective positioning of said masking means over said blank.

13. The apparatus as defined by claim 11 wherein said masking means and holder are of a material selected from the group consisting of tetrafluoroethylene, polytetrafluoroethylene, and a perfluoroelastomer.

14. The apparatus as defined by claim 11 including a photolytic etchant material on said exposed face portion, said source being a source of radiation of a predetermined wavelength to cause said etching of said exposed face portion.

15. The apparatus as defined by claim 11 wherein said blank includes a pair of opposing major faces and wherein said masking means comprises a respective masking member located adjacent each of said major faces for covering selected portions of each to permit formation of mesas on both sides of said blank and which are adapted to be thereafter lapped to provide substantially smooth surfaces.

16. The apparatus as defined by claim 15 wherein said masking members are removable in mutually opposite directions.

17. The apparatus as defined by claim 16 wherein said mask members are removed at a uniform rate to vary the depth of etching uniformly across said major faces and providing thereby opposing parallel faces having angles of cut modified as a function of the rate of removal.

18. The apparatus as defined by claim 11 wherein said holder comprises an upper and lower rectangularly shaped member and wherein one of said members at least includes a central opening for exposing said resonator blank to said source, and the other of said members includes means for holding said blank in place.

19. The apparatus as defined by claim 18 wherein said other of said members includes a recess for holding said blank in place.

* * * * *